June 30, 1970 J. A. MILLER ET AL 3,518,584
GYRATOR CIRCUIT UTILIZING A PLURALITY OF CASCADED
PAIRS OF INSULATED-GATE, FIELD EFFECT TRANSISTORS
Filed July 25, 1968

$R_i = \frac{1}{y_{11}}$, $L = \frac{C}{y_{12}y_{21}}$, $R_S = \frac{y_{22}}{y_{12}y_{21}}$ INVENTORS J. A. MILLER
D. H. NASH
BY [signature]
ATTORNEY

United States Patent Office 3,518,584

Patented June 30, 1970

3,518,584

GYRATOR CIRCUIT UTILIZING A PLURALITY OF CASCADED PAIRS OF INSULATED-GATE, FIELD EFFECT TRANSISTORS

John A. Miller, Lawrence Harbor, and Donald H. Nash, Colts Neck, N.J., assignors to Bell Telephone Laboratories, Incorporated, Murray Hill, N.J., a corporation of New York Filed July 25, 1968, Ser. No. 747,650
Int. Cl. H03h 7/44, 11/00
U.S. Cl. 333—80 7 Claims

ABSTRACT OF THE DISCLOSURE

The fabrication of a gyrator circuit by fully integrated monolithic chip technology is made possible by utilizing a combination of substantially identical cascaded pairs of solid state unipolar devices.

BACKGROUND OF THE INVENTION

Field of the invention

This invention relates to gyrator circuits and more particularly to realizable gyrator circuits capable of fabrication by integrated circuit techniques.

Description of the prior art

The present state of the integrated circuit art is marked by increasingly widespread and commercial production in virtually every area in the field of electronics. At the current rate at which fabrication techniques are being improved and with the attendant reductions in cost that have been achieved, continued growth in the use of integrated circuits seems assured. The term "integrated circuit," although essentially a generic term, is often confusing owing to its common usage in identifying any one or all of several distinct miniaturized or microelectronic circuit types. Integrated circuits actually encompass four major subdivisions, thin film, monolithic, hybrid and compatible. Thin film integrated circuits are formed from microscopically thin films of material deposited on a ceramic substrate to form passive circuit components such as resistors and capacitors. Monolithic of "fully" integrated circuits comprise tiny blocks or dice of silicon and all of the circuit components, both active and passive, are fabricated into the blocks. Interconnections between the elements within a particular block are made by means of metalized patterns and the individual parts are inseparable from the complete circuit. Hybrid integrated circuits, as the term implies, are combinations—combinations of thin film and discrete circuit elements or, combinations of thin film and monolithic circuits. The fourth division, compatible circuits, comprises a combination of monolithic and thin film, the active components being formed within the silicon die and the passive components being deposited by thin film techniques on top of a silicon dioxide passivating layer which covers the active elements.

A basic problem which continues to inhibit the full potential usefulness of integrated circuits involves the use of inductive circuit elements. No satisfactory means has yet been devised of fabricating an inductive element by monolithic, thin film or compatible techniques. Obviously, discrete inductive elements can be added to hybrid circuits but the physical size of such elements is generally inconsistent with the miniaturization that the circuit designer seeks to achieve.

One approach to a solution of the problem indicated lies in the use of gyrator circuits in lieu of inductors, the gyrator circuits being formed from a combination of active and passive elements which, together, create an inductive effect. Such gyrator circuits are typically identified in terms of the admittance matrix of the two-port network formed from the particular circuit combination indicated. An ideal gyrator admittance matrix is conventionally identified by the following matrix expression:

$$Y=\begin{bmatrix} 0 & -G \\ +G & 0 \end{bmatrix} \quad (1)$$

A variety of circuit combinations have been proposed heretofore directed toward the end of achieving a gyrator that readily lends itself to fabrication by integrated circuit techniques—and many of these are at least marginally capable of embodiment by hybrid circuit techniques. One illustrative circuit of this type has been disclosed by D. F. Sheahan and H. J. Orchard in Electronics Letters, October 1966, vol. 2, No. 10. Such prior art circuits, however, typically require an excessive number of circuit elements and, of even greater concern, these elements are of diverse types, including resistors, capacitors and both unipolar and bipolar transistors of different conductivity types. As a result, the complexity and cost of fabricating such circuits by monolithic techniques or even by hybrid techniques is commercially impractical.

Accordingly, a general object of the invention is to reduce the complexity of gyrator circuits to the point where commercial production by monolithic fabrication techniques can be effected.

SUMMARY OF THE INVENTION

The stated object and related objects are achieved in accordance with the principles of the invention by a gyrator circuit comprising three cascoded pairs of insulated-gate field-effect transistors (IGFET's), each pair forming a simple voltage-controlled current generator. As applied to field-effect transistors, a cascode circuit consists of a transistor operated as a common-source amplifier driving a second transistor operating in common gate configuration. The three stages are cascoded in a loop to synthesize the normal gyrator admittance matrix.

In accordance with one feature of the invention the gyrator is self-biasing and consequently no additional circuit elements are required to establish required biasing levels.

The aspect of the invention that renders the circuit particularly attractive from the standpoint of ease of fabrication relates first to the fact that no circuit elements other than active elements are required and second to the fact that all of the active elements are of the same type, i.e., IGFET's, and, moreover, each of the IGFET's is of the same channel conductivity type.

The self-biasing feature of a gyrator circuit in accordance with the invention requires that a near ideal circuit balance be maintained which in turn requires that the IGFET parameters meet exceedingly close tolerances. In the present state of the monolithic circuit art such tolerances can be achieved with relatively little difficulty, provided, however, that the circuits involved are not complex—and, in general, the less complex the circuit, the more closely design tolerances can be realized. The particular tolerances concerned involve both dimensional ratios and material composition. These parameters are invariant from stage to stage and consequently, the problems of duplicating device characteristics are simplified by orders of magnitude in gyrator circuits in accordance with the invention as compared to prior art gyrators which require diverse circuit elements.

DESCRIPTION OF AN EMBODIMENT

Figure 1:
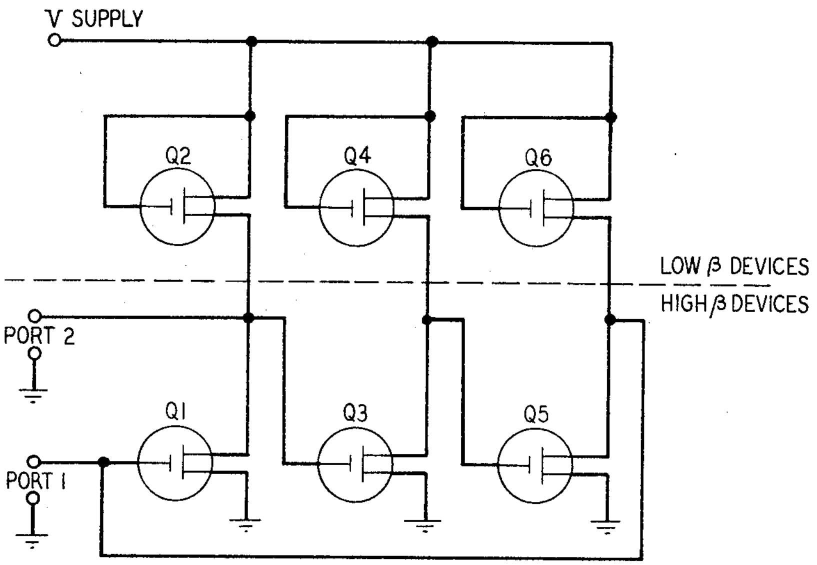
FIG. 1 is a schematic circuit diagram of a gyrator circuit in accordance with the invention.

In FIG. 1, each of the devices Q1 through Q6 is an insulated-gate field-effect transistor (IGFET). Each of the IGFET's is a P-channel device and the V supply, a direct current source for biasing, is negative. Alternatively, each of the IGFET's may be an N-channel device in which event the V supply source would be positive. For reasons discussed hereinbelow, each of the devices, Q1, Q3 and Q5 is designed with a relatively high $\beta$ and each of the devices Q2, Q4 and Q6 is designed with a relatively low $\beta$; where $$\beta=b(W/L) \qquad (2)$$

$b$ is a small determinable constant related to channel-thickness, mobility and dielectric constant; where W is the width of the channel region; and where L is the length of the channel region.

As shown, the IGFET's are interconnected to form a two-port network. Each of the three pairs Q1–Q2, Q3–Q4 and Q5–Q6 may be regarded as a current source and the three sources are serially connected in a closed loop. Each of the source electrodes of IGFET's Q1, Q3 and Q5 is grounded, whereas the drain electrodes of IGFET's Q2, Q4 and Q6 are connected to the V supply. The IGFET's Q1, Q3 and Q5 operate as the gain elements of their respective stages, whereas the IGFET's Q2, Q4 and Q6 operate as load resistors.

Figure 2:
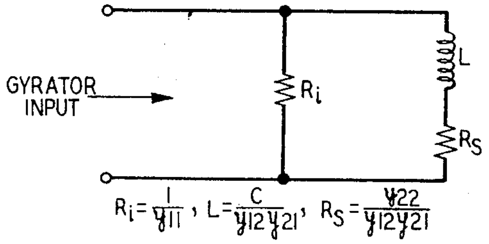
FIG. 2 is a schematic circuit diagram of an equivalent circuit of the circuit shown in FIG. 1, provided that the circuit of FIG. 1 is capacitively loaded.

With port 1 as the input port and port 2 as the output port, a circuit in accordance with the invention as shown in FIG. 1, when loaded with a capacitor C, exhibits the characteristics of the equivalent circuit shown in FIG. 2. The circuit components $R_i$, L and $R_s$ may be defined as follows:

$$R_i=\frac{1}{y_{11}}$$

$$L=\frac{C}{y_{12}-y_{21}}$$

and $$R_s=\frac{y_{22}}{y_{12}y_{21}} \qquad (3)$$

where the $y$ parameters correspond to conventional two-port parameters. The equivalence of the circuits indicated is supported by both theoretical analysis and by physical circuit measurements. In one circuit of the general type illustrated in FIG. 1, with a capacitor of 0.006 $\mu$f. terminating port 2, circuit measurements produced the following magnitudes for the equivalent elements if FIG. 2: $R_1\approx 70K\Omega$, $R_s\approx 150\Omega$ and $L\approx 70$ mh.

A fuller understanding of the principles of the invention may be gained from a brief consideration of certain aspects of the network theory involved. Since the admittance matrix $Y$ of an ideal gyrator circuit may be defined by $$Y=\begin{bmatrix} 0 & -G \\ +G & 0 \end{bmatrix} \qquad (1)$$

it is evident that the circuit current $i$ may be expressed by $$\begin{bmatrix} i_1 \\ i_2 \end{bmatrix}=\begin{bmatrix} 0 & 0 \\ +G & 0 \end{bmatrix}\begin{bmatrix} V_1 \\ V_2 \end{bmatrix}+\begin{bmatrix} 0 & -G \\ 0 & 0 \end{bmatrix}\begin{bmatrix} V_1 \\ V_2 \end{bmatrix} \qquad (4)$$

Figure 3:
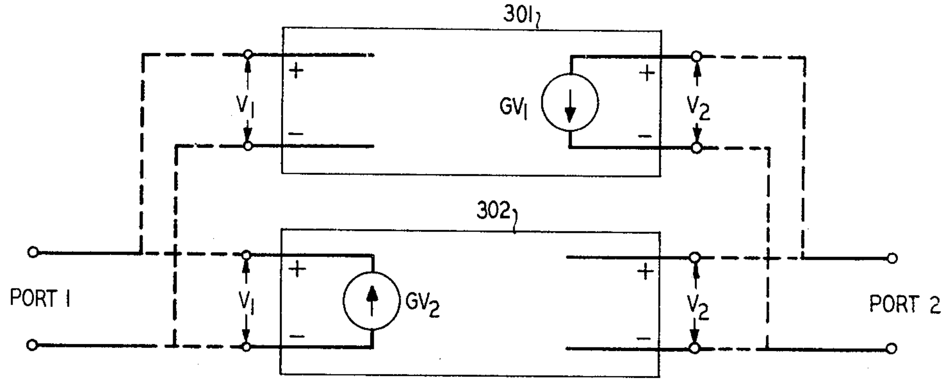
FIG. 3 is a block diagram of a circuit in accordance with the invention.

A corresponding circuit in block diagram form is shown in FIG. 3. Circuit block 301 corresponds to the first term in Equation 4 and the block 302 corresponds to the second term. Voltages $V_1$, $V_2$ are measured across the terminals indicated. It is evident that inversion is required inasmuch as the only distinction between circuit blocks 301 and 302 is the direction of the amplified currents $GV_1$ and $GV_2$.

An examination of the admittance characterisics of an IGFET is useful as a first step toward the realization that these characteristics, when combined in accordance with the principles of the invention, may be exploited to produce a realizable gyrator circuit. The $y$ parameters of the indefinite admittance matrix for a single IGFET operating in the pinch-off region are defined as follows:

$$\begin{bmatrix} i_D \\ i_S \\ i_G \\ i_U \end{bmatrix}=\begin{bmatrix} y_{11} & y_{12} & y_{13} & y_{14} \\ -y_{11} & -y_{12} & -y_{13} & -y_{14} \\ 0 & 0 & 0 & 0 \\ 0 & 0 & 0 & 0 \end{bmatrix}\begin{bmatrix} V_D \\ V_S \\ V_G \\ V_U \end{bmatrix} \qquad (5)$$

where the drain D, source S, gate G and substrate U currents and voltages are defined in the usual way and where $$\begin{aligned} y_{11}&=\beta/2[V_{GS}-V_T]^2 l \\ y_{12}&=-(y_{11}+y_{13}+y_{14}) \\ y_{13}&=\beta(1+lV_{DS})(V_{GS}-V_T) \\ y_{14}&=y_{13}(2aV_{SU}+c) \end{aligned} \qquad (6)$$

Illustrative values for the empirical constants indicated are $l=0.015$, $a=-0.022$ and $c=0.33$.

The term $\beta$, as pointed out above, is defined as $$\beta=b(W/L)$$

where $$W/L \underset{=}{\Delta} \text{Width/Length} \qquad (7)$$

(of the channel region). The empirical constant $b$, defined above, may have a numerical value on the order of $5.05\times 10^{-6}$.

In the circuit of FIG. 1 it has been noted that the devices Q2, Q4 and Q6 are designed, in accordance with the invention, with a lower $\beta$ than the devices Q1, Q3 and Q5. Since the operating threshold voltage $V_T$ is thus different for the two sets of devices, it is also of interest to note that this voltage may be defined as follows:

$$V_T\approx V_{TO}+aV_{SU}^2+cV_{SU} \qquad (8)$$

where $V_{TO}$ is the initial or contant threshold voltage.

In accordance with the invention, the D-C equilibrium conditions of the circuit of FIG. 1 are used to determine $V_G$ and $V_D$ on the IGFET's Q1, Q3 and Q5. For example, the currents of each of these devices may be set equal and the gate and drain voltages may also be set equal. At this point it should be noted that circuit operation with equal gate and drain voltages is a characteristic of IGFET devices although these voltages differ in conventional field-effect transistors (FET's).

From the foregoing, assuming that the constants $l$ and $a$ can be neglected for the moment, the following expression results:

$$V_G=V_D=\frac{V_{\text{supply}}-V_{TO}\left[1-\frac{\sqrt{(W/L)_B}}{\sqrt{(W/L)_T}}\right]}{1+c+\frac{\sqrt{(W/L)_B}}{\sqrt{(W/L)_T}}} \qquad (9)$$

With reference again to FIG. 1, the following two-port matrix can be calculated:

$$Y=\begin{bmatrix} y_{11}-y_{12}' & \frac{-y_{13}^2}{y_{11}-y_{12}'} \\ y_{13} & y_{11}-y_{12}' \end{bmatrix} \qquad (10)$$

where the admittances of the IGFET's Q2, Q4 and Q6 are designated by the prime notation and the admittances of the IGFET's Q1, Q3 and Q5 are not so designated. The fact that the diagonal terms are not equal to zero, i.e., $$y_{11}-y_{12}'\neq 0 \qquad (11)$$

indicates that the gyrator is not ideal. The $Q_{max}$ of the circuit can readily be calculated from the expression:

$$Q_{max} \approx \frac{1}{2} \frac{\sqrt{y_{13}^3}}{\sqrt{(y_{11}-y_{12}')^3}} \quad (12)$$

In one experimental circuit constructed in accordance with the invention y-parameters employed had approximately the following values:

$$\begin{array}{ll} y_{11}=2.665\times10^{-7} & y_{11}'=2.728\times10^{-7} \\ y_{12}=-1.488\times10^{-4} & y_{12}'=-1.537\times10^{-5} \\ y_{13}=1.118\times10^{-4} & y_{13}'=1.187\times10^{-5} \\ y_{14}=3.675\times10^{-5} & y_{14}'=3.225\times10^{-6} \end{array} \quad (13)$$

Using these y-parameters, the forward and reverse gyration resistances $\gamma 1$ and $\gamma 2$ (with respect to port 1 of the circuit of FIG. 1) are as follows:

$$\gamma 1 = \frac{y_{11}-y_{12}'}{y_{13}^2} = 1290\Omega$$

$$\gamma 2 = \frac{1}{y_{13}} = 9000\Omega \quad (14)$$

Comparing these values on a power handling basis shows the desirability of driving the circuit from port 1.

In the experimental circuit indicated, the value of $Q_{max}$ was found to be approximately 10 which occurred at a frequency of about 5 kHz. Also in this circuit the values of the circuit parameters of FIG. 2, as defined by Equation 3 were as previously stated, i.e., $R_1 \approx 70$ KΩ, $R_s \approx 150\Omega$ and $L \approx 70$ mh.

It is to be understood that the embodiment described herein is merely illustrative of the principles of the invention. Various modifications thereto may be effected by persons skilled in the art without departing from the spirit and scope of the invention.

What is claimed is:

1. A gyrator circuit comprising, in combination, a plurality of cascoded pairs of insulated-gate, field-effect transistors forming voltage-controlled current generators, said generators being paralleled to synthesize the admittance matrix of said gyrator, one half of said transistors operating as active current sources and the other half of said transistors operating as load resistors, all of said transistors being substantially identical with the exception that the $\beta$ parameter of said one half of said transistors exceeds the $\beta$ parameter of said other half, all of said transistors being of like conductivity type.

2. A self-biasing gyrator circuit comprising, in combination, a plurality of pairs of insulated-gate, field-effect transistors, each of said pairs being cascoded to form a voltage-controlled current generator, said generators being connected in parallel circuit form to synthesize the admittance matrix of said gyrator, said circuit being devoid of other circuit elements, all of said transistors being of a common conductivity type, one transistor of each of said pairs operating as a current source and the other transistor of each of said pairs operating as a load resistor, the source electrode of each of said one transistors being connected to a source of reference potential, a source of bias potential and each of the drain electrodes of each of said other transistors being connected to said source of bias potential.

3. A gyrator circuit comprising, in combination, first and second ports, a first pair of insulated-gate, field-effect transistors connected in cascode and operating as a current source stage, a second pair of insulated-gate, field-effect transistors connected in cascode operating as a gain-inverter stage, a third pair of insulated-gate, field-effect transistors connected in cascode operating as a current source stage, said gain-inverter stage being connected intermediate said current source stages, said pairs being connected serially in a closed loop, a source of reference potential, said first port being defined as between said last named source and a junction common to the gate electrode of one of said transistors in said first pair and the drain electrode of one of said transistors in said third pair and the source electrode of the other of said transistors in said third pair, and said second port being defined as between said last named source and a junction common to the drain electrode of one of said transistors in said first pair, the source electrode of the other of said transistors in said first pair and the gate electrode of one of said transistors in said second pair.

4. Apparatus in accordance with claim 3 including a source of bias voltage and means connecting the drain electrode of one of said transistors in each of said pairs to said source of bias voltage.

5. Apparatus in accordance with claim 4 wherein the gate electrode of each of said last named transistors is connected directly to its correspoding drain electrode.

6. Apparatus in accordance with claim 4 wherein each of said transistors is of a common channel-region conductivity type.

7. Apparatus in accordance with claim 6 wherein one of said transistors in each of said pairs has a first common $\beta$ parameter and wherein the other transistor in each of said pairs has a second common $\beta$ parameter, said first $\beta$ parameter exceeding said second $\beta$ parameter.

References Cited

UNITED STATES PATENTS

| | | | |
|---|---|---|---|
| 3,355,598 | 11/1967 | Tuska | 307—304 |
| 3,395,290 | 7/1968 | Farina et al. | |
| 3,395,292 | 7/1968 | Bogert | 307—304 X |
| 3,435,138 | 3/1969 | Borkan | 307—304 X |

HERMAN KARL SAALBACH, Primary Examiner

P. L. GENSLER, Assistant Examiner

U.S. Cl. X.R.

307—295, 304